(12) United States Patent
Igel et al.

(10) Patent No.: US 6,294,218 B1
(45) Date of Patent: Sep. 25, 2001

(54) PROCESS FOR COATING A SUBSTRATE

(75) Inventors: Günter Igel, Teningen; Joachim Krumrey, Munich, both of (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/339,898

(22) Filed: Jun. 25, 1999

(30) Foreign Application Priority Data

Jun. 27, 1998 (DE) .............................................. 198 28 846

(51) Int. Cl.⁷ ....................................................... B05D 5/00
(52) U.S. Cl. ........................ 427/264; 427/261; 427/266; 427/269; 427/270; 427/271; 427/287; 427/397.7
(58) Field of Search ................................... 427/261, 264, 427/265, 266, 269, 270, 271, 287, 397.7

(56) References Cited

U.S. PATENT DOCUMENTS

| | | | |
|---|---|---|---|
| 3,231,421 | 1/1966 | Schmidt | 117/2.2 |
| 3,642,528 | * 2/1972 | Kimura | 117/212 |
| 5,591,321 | * 1/1997 | Pyke | 205/787 |
| 5,645,976 | 7/1997 | Azuma | 430/313 |
| 5,668,301 | * 9/1997 | Hunter | 73/23.2 |
| 5,693,545 | * 12/1997 | Chung et al. | 437/40 |
| 6,017,775 | * 1/2000 | Igel et al. | 438/48 |
| 6,127,268 | * 10/2000 | Igel | 438/678 |

FOREIGN PATENT DOCUMENTS

| | | |
|---|---|---|
| 540 568 | 9/1973 | (CH) . |
| 2 059 175 | 7/1972 | (DE) . |
| 1 927 646 | 2/1973 | (DE) . |
| 2 163 176 | 7/1973 | (DE) . |
| 25 38 907 | 3/1977 | (DE) . |
| 196 41 777 A 1 | 4/1998 | (DE) . |
| 1 321 034 | 6/1973 | (GB) . |
| 58 035985 A | 3/1983 | (JP) . |
| 58 035986 A | 3/1983 | (JP) . |

* cited by examiner

Primary Examiner—Shrive P. Beck
Assistant Examiner—Kirsten A. Crockford
(74) Attorney, Agent, or Firm—Akin, Gump, Strauss, Hauer & Feld, L.L.P.

(57) ABSTRACT

In a process for coating a substrate, a texture (4) is created in a portion of its surface. A first layer (5) to be applied on the surface of the substrate adheres better to the texture (4) than it does to a surface area located outside of the texture (4). Then, the layer (5) is applied to the surface of the substrate and after that, areas of the layer projecting laterally beyond the texture (4) are mechanically removed. The material of the texture (4) contains at least one chemical element or a compound, which the layer (5) does not have or has only in a smaller concentration than the material of the texture (4). On the first layer (5), at least one second layer (7) is then applied which does not have the chemical element or compound contained in the material of the texture (4), or it has it only in a smaller concentration than the material of the texture (4). The process makes it possible to apply to a substrate a textured layer, which has surface properties that remain for the most part unchanged when it is heated.

13 Claims, 4 Drawing Sheets

PROCESS FOR COATING A SUBSTRATE

BACKGROUND OF THE INVENTION

The present invention involves a process for coating a substrate, in particular for manufacturing a sensor, wherein on a portion of the surface of the substrate, at least one texture is created on which a layer that is to be applied on the surface of the substrate, adheres better than on a surface area of the substrate located outside of the texture, wherein the layer is applied after creating the texture on the surface of the substrate and areas of the layer which overhang laterally beyond the texture are removed mechanically, and wherein the material of the texture contains at least one chemical element or a chemical compound, which the layer applied on the texture does not have or has only in a smaller concentration than the material of the texture.

From German published patent application DE 196 41 777 A1, it is already known to use such a process for the manufacture of a sensor with a metal electrode in a MOS-arrangement. This process has thus proven itself to be advantageous in practice, since it makes possible a textured coating of a substrate, without the coating applied to the substrate having to be textured for this using a photolithographic process and/or an etching process. A contamination of the manufacturing facilities used for the MOS semiconductor manufacture by the metallic electrode material to be applied to the substrate is thus avoided. A contamination of this sort can occur, for example, in photolithographic texturing processes when stripping the photoresist or when etching the metallic layer to be textured. Metallic contaminations of the manufacturing facilities are therefore especially undesirable, since they reduce the puncture resistance of gate oxides and thus reduce the reliability of the semiconductors manufactured with the manufacturing facilities.

A disadvantage of the previously known coating process consists, however, in that the layer may only be applied with a relatively small thickness, since the areas of the layer overhanging laterally beyond the texture can otherwise not be removed by mechanical mechanisms. The layers manufactured according to the process mentioned at the beginning therefore have only a comparatively small resistance to temperature, that is, the chemical compounds or elements located in the textured area of the substrate, such as silicon, can diffuse out of the substrate into the layer that is applied onto it, and possibly reach the surface of this layer. In the process, it is even possible that the substances diffused out of the substrate into the layer enter into a chemical bond with the materials contained in the layer and/or mix with them and change their chemical and/or physical properties, for example the resistance to corrosion. Such an undesired diffusion of materials out of the substrate into the layer applied on it occurs especially at higher temperatures, for example above 100° C. Such temperatures are, however, unavoidable in the manufacture of semiconductors and can, for example, occur during a temperature treatment for curing (hardening) on a lacquer coat located on the substrate or when applying a bonding compound on the substrate.

SUMMARY OF THE INVENTION

Therefore, an object of the invention is to create a process of the type mentioned at the beginning, in which the chemical and/or physical properties are largely stable with respect a temperature treatment of the substrate in an area near the surface of a layer applied on the substrate.

The solution of this object consists in that on the first layer applied to the surface, at least one second layer is applied, and that the second layer does not have the chemical element or chemical compound contained in the material of the texture, or has it only in a concentration smaller than that of the material of the texture.

In an apparently unnecessary manner, a second layer connected with the already textured first layer is thus applied onto the already textured first layer and has the same texture as the first layer. In this way, on the one hand, a larger layer thickness is achieved so that the chemical elements or compounds located in the substrate have to travel a larger distance, in order to reach the surface of the topmost layer, and on the other hand, however, a boundary surface is also created between the first and the second layer, which possibly makes more difficult the diffusion of materials out of the substrate into the second layer. The process according to the invention thus allows, without the use of photolithography or etching processes, and thus while avoiding a cross-contamination of the manufacturing facilities used for the manufacture of a sensor by chemical elements or compounds contained in the coating, the application of a textured layer onto a portion of the surface of a substrate, wherein the layer is, at least in an area near the surface, to the greatest extent stable in its chemical composition and physical properties, with respect to temperatures occurring during a temperature treatment. Optionally, at least one additional layer can be applied onto this layer.

One embodiment of the invention provides that the areas of the first layer projecting laterally beyond the texture are removed prior to the application of the second layer, in particular by using ultrasound. The second layer is thus applied in a later manufacturing step than the first layer so that chemical elements or compounds, which diffuse out of the substrate into the first layer during a temperature treatment occurring between the application of the first and the second layer, can then not progress beyond the surface of the first layer. The concentration of the chemical elements or compounds diffused out of the substrate which is reached on the surface of the first layer, which is smaller than the concentration of these elements or compounds in the substrate, then forms, after the application of the second layer, the starting point for a possible additional diffusion of these elements or compounds at the surface of this layer, so that the elements or compounds can reach there only at a correspondingly smaller concentration.

The areas of the first layer projecting laterally beyond the texture are removed, preferably using ultrasound, wherein due to the better adherence properties of the texture in comparison to the untextured substrate surface, it is achieved that the first layer only remains adhering to the texture, while the areas of this layer projecting beyond the texture detach from the substrate. The projecting areas of the first layer can, however, also be removed using other mechanical processing procedures, for example by brushing.

It is advantageous if the second layer is applied onto the electrically conducting first layer by galvanic or external currentless deposition of a metal, in particular a noble metal. The deposition of the metal is preferably performed in an external currentless manner.

A preferred embodiment of the invention provides that the second layer is applied on the surface of the substrate after the areas of the first layer projecting laterally beyond the texture have been removed, that the adherence properties of the second layer are so chosen that the second layer adheres better to the first layer than to a surface area of the substrate that does not have the first layer, and that after the application of the second layer, areas of the second layer projecting laterally beyond the first layer are mechanically removed, particularly by using ultrasound. For this purpose, the adherence properties of the second layer can be achieved by a suitable shaping of the surface of the first layer, for example a micro-roughness, and/or by a chemical property of the layer, such as the presence of unsaturated chemical bonds. Surprisingly, it is also possible to apply a second layer on the first layer by a suitable selection of the adherence properties of the first layer, and to texture it also by mechanically removing its areas that project laterally beyond the texture or the edge of the first layer. Thus, on the whole, a coating can be produced that has a comparatively large thickness and thus the areas projecting beyond the texture can be removed from the substrate without, at the same time, the areas of the coating located on the texture becoming detached from the substrate.

According to another advantageous embodiment of the invention, it is provided that first the first layer, and then on it the second layer, as well as optionally at least one additional layer thereon, are applied, and that after that the areas of these layers projecting laterally beyond the texture are mechanically removed at the same time, in particular by using ultrasound. In this process, it is even possible, for the second and/or other layers directly or indirectly applied to them, that materials can be used which adhere to the texture just as well as or even worse than they adhere to a surface area of the substrate located outside of the texture, and that the layers consisting of these materials are intermediately textured by of the first layer mounted directly on the substrate surface. In this way, even other layers, which can be textured not at all or only poorly using other processes, can be textured in a simple way by the mediation of the first layer. For this purpose, the first layer exhibits a larger difference between the adherence capacity to the texture and the adherence capacity to the surface area of the substrate that does not have the texture, than do the other layers on the first layer. In the other layers, intermediately textured, it thus does not depend on an adherence difference, but instead it is sufficient when these adhere sufficiently well to the first layer. Thus, by suitable selection of the adherence properties of the first layer, other layers consisting of practically any material can be textured.

It is especially advantageous if the second layer and/or at least one other layer directly or indirectly applied on it is applied at a smaller thickness than the first layer. The second layer and/or the other layers applied on it can thereby be better textured by the mediation of the first layer. In particular, areas of the second layer or the other layers projecting laterally beyond the texture located on the surface of the substrate can be removed in a manner that is mechanically easier.

It is especially advantageous if the first and/or second layer and/or at least one other layer mounted on the second layer is(are) mechanically stressed by introduction of foreign atoms (i.e., to generate mechanical stresses or distortions in the crystal structure) prior to the removal of the areas projecting beyond the texture. The projections projecting laterally beyond the texture can then be removed more easily, for example using ultrasound. The layer can, for example, be exposed to a hydrogen-containing atmosphere for introduction of hydrogen atoms. Another possibility for introduction of foreign atoms consists in implanting into the layer ions or similar particles.

According to one embodiment of the invention, it is provided that for the first and the second layers and optionally at least one additional layer applied on the second layer, the same material is used. The process can then be implemented in an especially simple manner. Thus, for example, on a metal layer arranged on a texture made of polysilicon, a layer made of the same metal can be applied in order to act against formation of silicide on the surface of the metal.

Another embodiment provides that for different layers, different materials are used. In this way, materials optionally of the same type can be used for these layers, for example different metals. Thus, for example, on one layer made of palladium, an additional layer made of iridiun can be applied. Optionally, a cost-effective material can also be used for the layer applied directly on the surface of the substrate, and this material can then be coated with a more expensive material. In this way, the more cost-effective material can function as a diffusion block for chemical elements or substances located in the substrate.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 1:
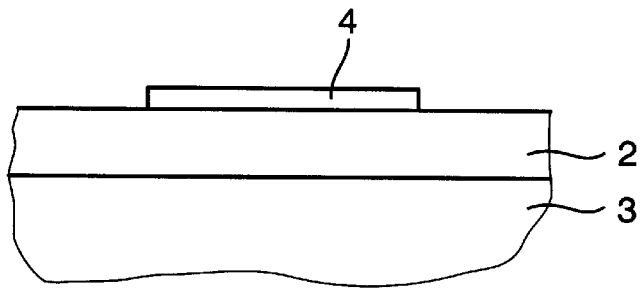
FIG. 1 is a partial cross-section through a substrate, which on its surface has a silicon oxide layer with a texture located on it.
Figure 2:
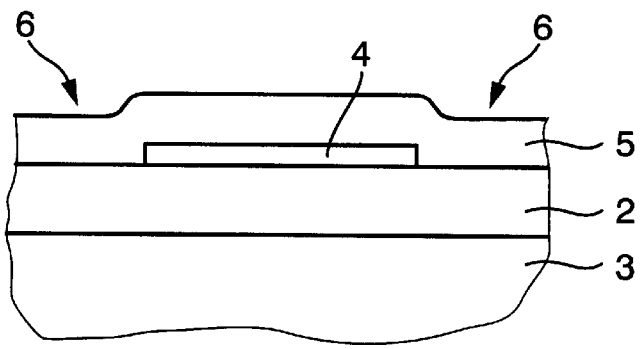
FIG. 2 is the arrangement shown in FIG. 1, after application of a palladium layer.

In a process for manufacturing a sensor 1 (FIGS. 6, 8), on a portion of the surface of a silicon oxide layer 2 of a substrate having a base structure 3 made of silicon, a texture 4 made of polysilicon is applied using masking technology (FIG. 1). The adhering properties of the texture 4 are selected such that a first layer 5 made of palladium to be applied thereon adheres better to the texture 4 than to the surface of the silicon oxide layer 2. After application of the texture 4, the first layer 5 made of palladium is applied to the surface of the substrate and the texture 4 over the whole surface (FIG. 2). This can be accomplished, for example, in such a manner that the substrate is arranged together with a palladium smelting crucible under vacuum, so that vapors emerging from the palladium condense on the substrate. Another coating possibility consists in that the palladium layer 5 is applied by sputtering. In this process, a palladium target is bombarded with a high-energy beam, whereby palladium emerges from the target and coats the substrate.

After application of the first layer 5, the areas 6 of the layer 5, located outside the texture 4 and projecting laterally beyond the texture 4, are mechanically removed. To do this, the first layer 5 can, for example, be brushed over the entire surface, such that the areas 6 of the layer 5 directly connected to the silicon oxide layer 2 detach, due to the only slight adherence there by the silicon oxide layer 2, while the areas of the layer 5 connected to the texture 4 remain adhering to the texture 4 because of the better adherence properties.

Another possibility for removing the areas 6 of the layer 5 projecting laterally beyond the texture consists in that the layer 5 is subjected to an ultrasound treatment, in which only the areas of the layer 5 arranged on the texture 4 remain adhering, while the remaining areas 6 of the layer 5 connected to the silicon oxide layer 2 detach from the substrate. In sum, the structure shown in FIG. 3 thus results, which has on a silicon oxide layer 2, a textured polysilicon layer 4, and on layer 4, a palladium layer 5, which is textured corresponding to texture 4.

Figure 3:
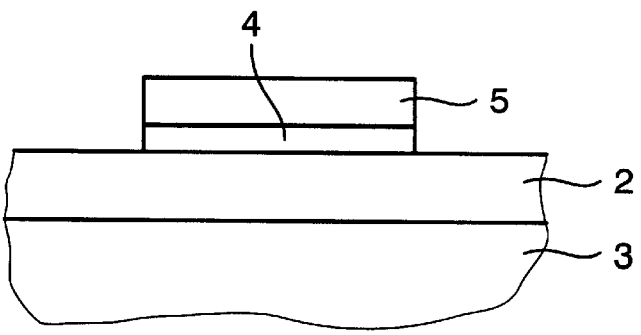
FIG. 3 is the arrangement shown in FIG. 2, after removal of the areas of the palladium layer that are bonded to the silicon oxide layer.
Figure 4:
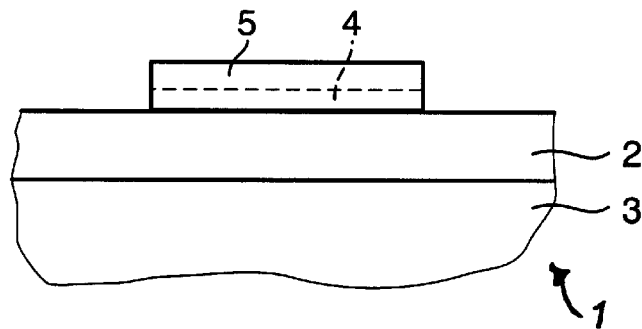
FIG. 4 is the arrangement shown in FIG. 3, after a temperature treatment.

In the course of an additional manufacturing step, the substrate shown in FIG. 3 is subjected to a temperature treatment, in which the substrate is exposed for approximately one hour to a temperature of 250° C. This temperature treatment can, for example, be provided to remove a photoresist layer applied to the surface of the substrate. Corresponding temperatures can, however, also occur when applying a bonding compound to the substrate.

Figure 8:
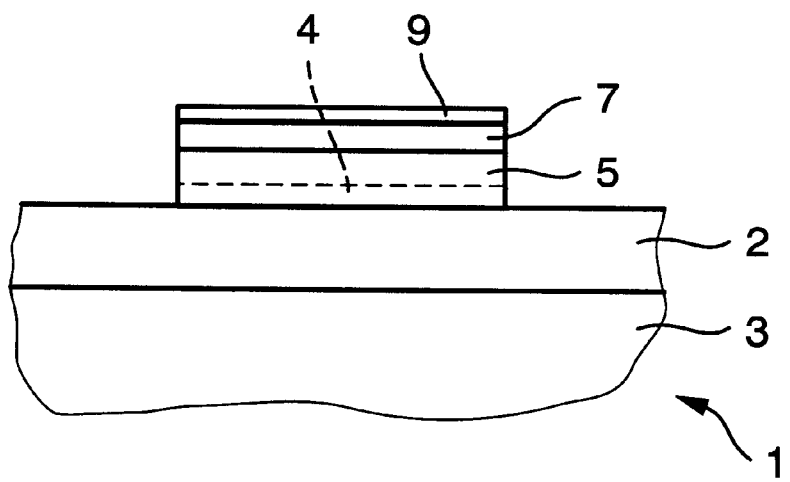
FIG. 8 is the body shown in FIG. 7, after removal of the areas of the palladium and iridium layer that project laterally beyond the texture.
Figure 9:
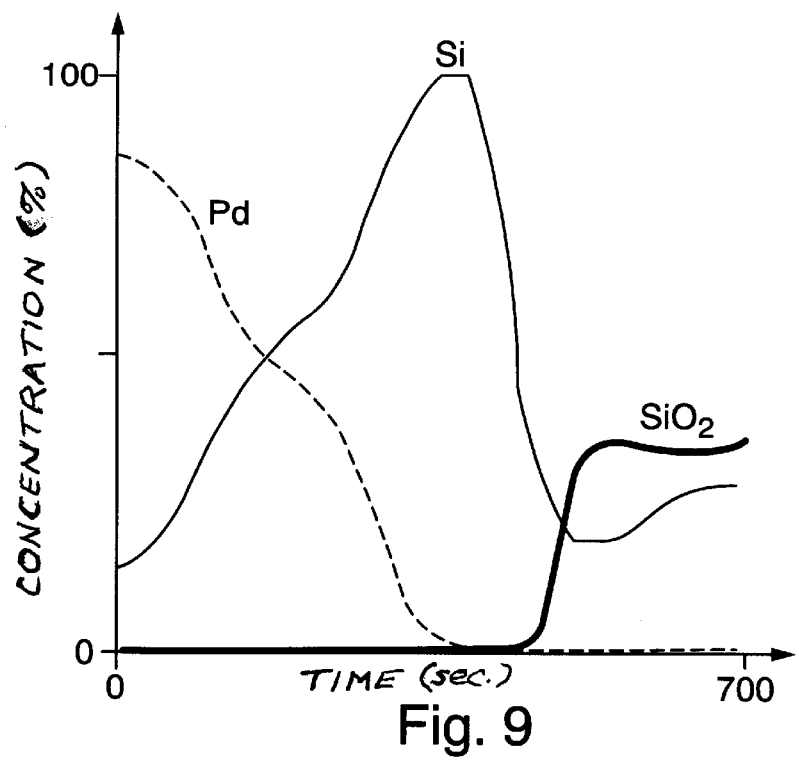
FIG. 9 is a deep profile analysis, in which from the coating of the sensor shown in FIG. 4, coating material is carried off by sputtering, wherein on the abscissa (x-axis) the duration of removal is shown, and on the ordinate (y-axis), the concentration of the components contained in the respective coating material carried away is shown.

FIG. 9 shows a deep profile analysis of the layer 5 and the texture 4. In the area of the layer 5 located on the texture 4, material was carried off from the surface of the substrate by sputtering over a time span of approximately 700 seconds, wherein the concentration of the material carried off was continuously monitored. It can be clearly seen that, on the one hand, silicon is diffused out of the texture 4 made of polysilicon up to the surface of the palladium layer and that, on the other hand, however, the palladium is also diffused out of the layer 5 into the texture 4. During the temperature treatment, an interdiffusion of the palladium and silicon contained in the layer 5 thus takes place, wherein palladium silicide then forms, which has a lower resistance to corrosion than metallic palladium. In order to indicate that the texture 4 and the layer 5 are diffused into each other, the boundary surface between the texture 4 and the layer 5 is depicted in FIGS. 4 to 8, respectively, in dashed lines.

Figure 5:
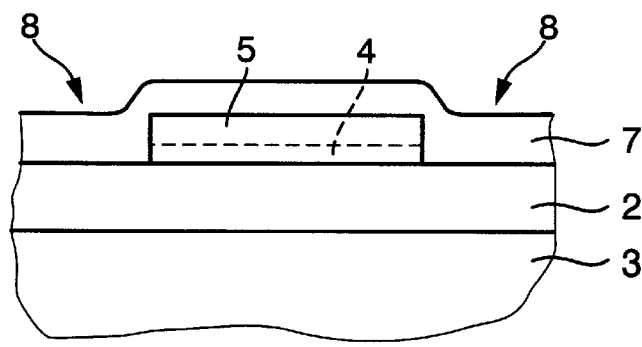
FIG. 5 is the arrangement shown in FIG. 4, after application of another palladium layer.

On the surface of the substrate, a second layer 7 made of metallic palladium is then applied, which covers the first layer 5 as well as the exposed surface areas of the silicon oxide layer 2 and is connected respectively to the layer 5 or the silicon oxide layer 2 (FIG. 5). The second layer 7 can be applied in the same manner as the first layer 5, for example by vapor-deposition or sputtering. The adherence properties of the second layer 7 are selected such that the second layer 7 adheres better to the first layer 5 than to the silicon oxide layer 2. It is thereby possible to texture the second layer 7 in the same way as the first layer, namely by mechanically removing the areas 8 that project laterally beyond the first layer 5 or the texture 4 and are connected to the silicon oxide layer 2. The removal of the areas 8 of the layer 7 can, for example, occur by brushing or by using ultrasound, whereby the areas 8 connected to the silicon oxide 2 are detached from the substrate, while the areas of the second layer 7 connected to the first layer 5 remain adhering to the first layer (FIG. 6).

Figure 6:
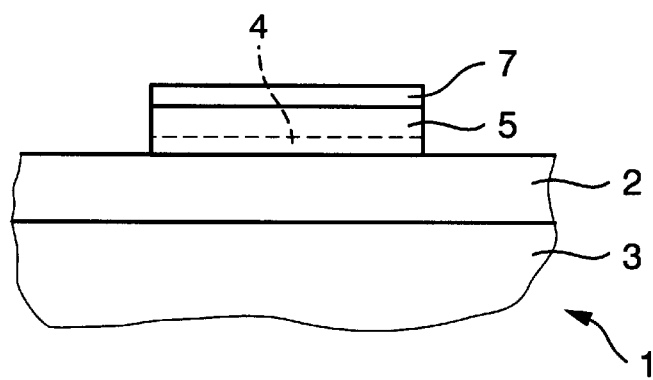
FIG. 6 is the body shown in FIG. 5, after removal of the areas of the palladium layer projecting laterally beyond the palladium silicide layer.
Figure 10:
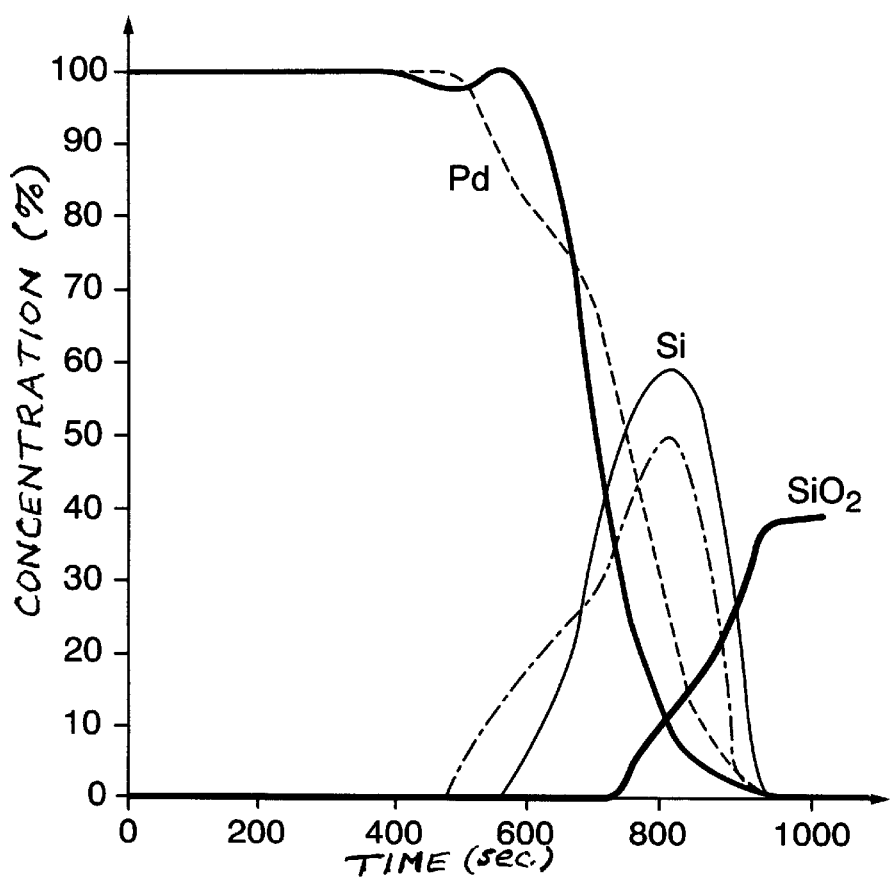
FIG. 10 is a corresponding deep profile analysis for the sensor according to FIG. 6.

FIG. 10 shows a deep profile analysis of the sensor 1 manufactured according to the process described and shown in FIG. 6 in the area of the layer sequence 2, 4, 5, 7. Here, the respective concentration progressions of palladium and silicon directly after the application of the second layer 7 are denoted by continuous lines. In addition, the corresponding concentration progressions after a one-hour tempering of the sensor at 250° C. are shown in the diagram by dashed lines. It can be clearly recognized that the silicon is diffused by tempering only in a comparatively narrow range at a distance relatively far from the surface of the second palladium layer 7 (on the left in FIG. 10) into all of layers 4, 5 and 7 that have palladium, and that after the tempering on the surface of the uppermost layer 7, a sufficiently wide area remains with a palladium concentration of approximately 100%. The chemical and physical properties in the areas of the sensor 1 near the surface of the palladium contact, formed by the two layers 5 and 7, are thus for the most part stable with respect to temperature processes.

As can be recognized by a comparison of FIG. 9 with FIG. 10, the palladium silicide concentration on the surface of the sensor 1 can be reduced from 15% to almost zero by the apparently unnecessary application of a second palladium layer 7 on the already existing palladium layer 5, whereby the resistance to corrosion of the palladium layer 7 is also particularly improved. By the previously described process, a substrate can be coated with a textured metal layer without the need for application of a photo-mask or an auxiliary mask on the metal layer and/or an etching of the metal layer. Consequently, a cross-contamination of the manufacturing facilities by the metal is avoided. The process is therefore particularly suitable for the manufacture of MOS-semiconductor circuits.

Figure 7:
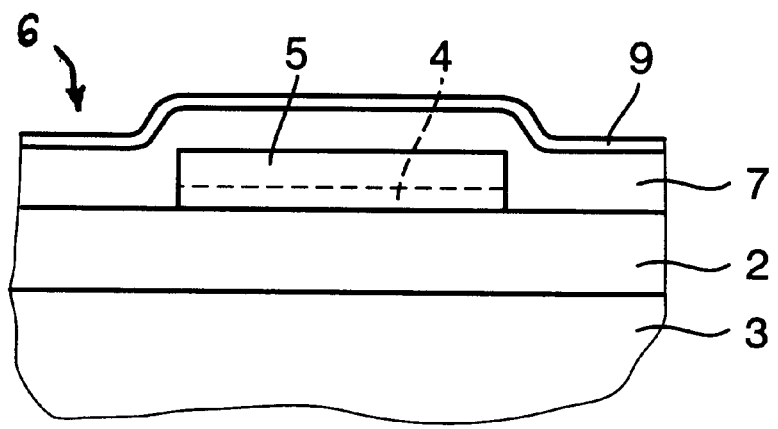
FIG. 7 is a representation similar to FIG. 5, wherein, however, in addition, another iridium layer is applied to the palladium layer.

In the embodiment according to FIG. 7, yet a third metallic layer 9 made of iridium, which is connected to the palladium layer 7 and adheres to it, is applied on the second palladium layer 7 of the arrangement according to FIG. 5. Thereafter, the areas of the layers 7 and 9 projecting laterally beyond the texture 4 are simultaneously mechanically removed. This can be accomplished, for example, by brushing the iridium layer 9 or by the application of ultrasound. In the process, the palladium layer 5 detaches from the silicon oxide layer 2 in those areas where it is connected to the silicon oxide layer 2, while at the same time the iridium layer 9 also located on these areas of the layer 7 is removed from the substrate. The areas of the second palladium layer 7 connected to the first palladium layer 5 remain, however, adhering to the palladium layer 5 together with the portions of the iridium layer 9 that is affixed to these areas. The iridium layer 9 is thus intermediately textured by the second palladium layer 7 and has, after removal of the areas 6 projecting laterally beyond the texture 4, a texture corresponding to that of the texture 4 (FIG. 8).

Consequently, the iridium layer, which can be textured only poorly using other processes, for example by etching, can be textured in a simple way.

The second palladium layer 7 connected to the iridium layer 9 and the boundary surface located between these layers act as a diffusion block for silicon found in the texture 4 and in the first palladium layer 5. The formation of iridium silicide is thereby prevented to the greatest extent possible. Also, a contamination of the manufacturing facilities with palladium and/or iridium is prevented.

As can be recognized from FIGS. 7 and 8, the iridium layer 9 is applied on the substrate at a smaller thickness than the palladium layer 5. The areas of the layers 7 and 9 projecting laterally beyond the texture 4 can be better removed thereby.

It should also be mentioned that in the two respective embodiments described above, prior to removal of the areas 8 projecting laterally beyond the texture 4 of the second palladium layer 7 and/or the iridium layer 9, this(these) layer(s) 7, 9 can be stressed by the incorporation of foreign atoms. The areas 8 of these layers 7 projecting laterally beyond the texture 4 can then be removed more easily by mechanical means.

The foreign atoms can, for example, be introduced into the palladium layer 7 and/or the iridium layer 9 (i.e., into the crystal structure) in that the surface of the palladium layer 7 or the iridium layer 9 is exposed to a hydrogen atmosphere. Another possibility for introducing the foreign atoms into the layer(s) 7, 9 consists in bombarding this(these) layer(s) 7, 9 with ions that then become embedded in the layer(s) 7, 9. The foreign atoms can, however, also be integrated into the texture 4 and/or the base structure 3, so that they can be diffused into this(these) layer(s) 7, 9—optionally by the action of heat—after the application of the layer(s).

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. A process for coating a substrate, comprising the steps of creating at least one silicon-containing texture (4) on a portion of a surface of a silicon oxide layer (2) of a substrate having a silicon base structure (3) on which a first layer (5) is to be applied, the texture (4) comprising a material such that the first layer (5) will adhere better to the texture (4) than to a surface area of the substrate located outside of the texture (4), wherein the material of the texture (4) contains at least one chemical element or chemical compound which is not present in the first layer (5) or is present in the first layer (5) only in a smaller concentration than in the material of the texture (4), applying the first layer (5) on the texture (4) and substrate (3), carrying out a temperature treatment to form a silicide on the substrate after applying the first layer (5), mechanically removing areas of the first layer (5) which project laterally beyond the texture (4), and after the temperature treatment applying on the first layer (5) at least one second layer (7, 9), wherein the at least one second layer (7, 9) does not have the chemical element or chemical compound contained in the material of the texture (4) or the at least one second layer (7, 9) has the chemical element or chemical compound only in a concentration smaller than that of the material of the texture (4).

2. The process according to claim 1, wherein the areas of the first layer (5) projecting laterally beyond the texture (4) are removed prior to application of the second layer (7).

3. The process according to claim 1, wherein the first layer (5) is an electrically conducting layer, and the second layer (7) is applied onto the electrically conducting first layer (5) by galvanic or external currentless deposition of a metal.

4. The process according to claim 1, wherein the second layer (7) is applied on the surface of the substrate after the areas of the first layer (5) projecting laterally beyond the texture (4) have been removed, the adherence properties of the second layer (7) being selected in such a manner that the second layer adheres better to the first layer (5) than to a surface area of the substrate that does not have the first layer (5), and after application of the second layer (7) areas of the second layer (7) projecting laterally beyond the first layer (5) are mechanically removed.

5. The process according to claim 1, wherein first the first layer (5), then on it the second layer (7) and optionally at least one additional layer (9) are applied, and thereafter the areas of these layers (5, 7, 9) projecting laterally beyond the texture (4) are mechanically removed at the same time.

6. The process according to claim 1, wherein the second layer (7) and/or at least one other layer (9) directly or indirectly applied on it is applied at a smaller thickness than the first layer (5).

7. The process according to claim 1, wherein at least one of the layers (5, 7, 9) is mechanically stressed by introduction of foreign atoms prior to removal of the areas projecting laterally beyond the texture (4).

8. The process according to claim 1, wherein the layers (5, 7, 9) comprise the same material.

9. The process according to claim 1, wherein the layers (5, 7, 9) comprise different materials.

10. The process according to claim 1, wherein at least one noble metal layer is applied as an uppermost layer.

11. The process according to claim 1, wherein the areas of the layer(s) projecting laterally beyond the texture (4) are removed by application of ultrasound.

12. The process according to claim 1, wherein the at least one second layer (7, 9) comprises a noble metal.

13. The process according to claim 1, wherein the process is a process for manufacturing a sensor (1).

\* \* \* \* \*